United States Patent
Lele et al.

(10) Patent No.: US 11,467,622 B2
(45) Date of Patent: Oct. 11, 2022

(54) CLOCK OSCILLATOR CONTROL CIRCUIT

(71) Applicant: TEXAS INSTRUMENTS INCORPORATED, Dallas, TX (US)

(72) Inventors: Atul Ramakant Lele, Bangalore (IN); Dirk Preikszat, Freising (DE); Sudhanshu Khanna, Plano, TX (US); John Joseph Seibold, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/182,547

(22) Filed: Feb. 23, 2021

(65) Prior Publication Data

US 2022/0269304 A1   Aug. 25, 2022

(51) Int. Cl.
    *G06F 1/08*      (2006.01)
    *H03K 5/00*      (2006.01)
    *G06F 1/12*      (2006.01)

(52) U.S. Cl.
    CPC .................. *G06F 1/08* (2013.01); *G06F 1/12* (2013.01); *H03K 5/00006* (2013.01); *H03K 2005/00058* (2013.01)

(58) Field of Classification Search
    CPC ......... G06F 1/08; G06F 1/12; H03K 5/00006; H03K 2005/00058
    See application file for complete search history.

(56) References Cited

U.S. PATENT DOCUMENTS

| | | | | |
|---|---|---|---|---|
| 5,642,104 A * | 6/1997 | Erwin | ..................... | H05B 47/13 340/13.31 |
| 5,834,957 A * | 11/1998 | Staton | ................... | H03K 3/0375 327/146 |
| 2010/0177588 A1* | 7/2010 | Kaiwa | .................. | G11C 7/1066 327/155 |
| 2013/0173951 A1* | 7/2013 | Vogel | ..................... | G06F 1/3262 713/600 |
| 2015/0227185 A1* | 8/2015 | Pal | ......................... | G06F 1/3203 713/320 |
| 2015/0288363 A1* | 10/2015 | Riexinger | ........... | H03K 19/0016 327/225 |
| 2015/0378423 A1* | 12/2015 | Hanssen | ................ | G06F 1/3296 713/323 |

* cited by examiner

*Primary Examiner* — Zahid Choudhury
(74) *Attorney, Agent, or Firm* — Carl G. Peterson; Charles A. Brill; Frank D. Cimino (57) ABSTRACT

A clock oscillator control circuit is provided. The clock oscillator control circuit includes a signal processor configured to receive a composite clock request signal and output a altered composite clock request signal. The clock oscillator control circuit also includes logic circuitry configured to receive the altered composite clock request signal from the signal processor and a clock oscillator valid signal from a clock oscillator, and to output set and reset signals based on the altered composite clock request signal and the clock oscillator valid signal. The clock oscillator control circuit further includes a set-reset latch configured to receive the set and reset signals from the logic circuitry and to output an enable signal to the clock oscillator.

20 Claims, 5 Drawing Sheets

CLOCK OSCILLATOR CONTROL CIRCUIT

TECHNICAL BACKGROUND

Large and complex circuit systems often include a large number of circuit modules, each requiring a clock input signal. Since these clock signals typically drive substantial loads, they consume large amounts of power. In order to reduce power consumption within these systems designers often disable clock signals when they are not needed by the circuit modules.

Commonly a single clock oscillator is used to provide clock signals to multiple circuit modules, and each circuit module is equipped with a clock request signal which it can assert when it needs to receive a clock input. This allows the clock oscillator to be inactive when none of the circuit modules it supplies require a clock input.

In typical systems multiple circuit modules may produce multiple asynchronous clock request signals. These multiple asynchronous clock request signals are then combined in a logical OR circuit and the resulting composite clock request signal is used to enable the clock oscillator.

Since these multiple clock request signals are independent and asynchronous, they may be asserted and de-asserted at any time without any knowledge or concern of the other clock request signals. When these signals are combined in the logical OR circuit, the resulting composite clock request signal may include short glitches, which when provided to the clock oscillator as an enable signal, may cause the clock oscillator to behave in an unpredictable manner.

Overview

In an implementation, a clock oscillator control circuit is provided. The clock oscillator control circuit includes a signal processor configured to receive a composite clock request signal and output a altered composite clock request signal.

The clock oscillator control circuit also includes logic circuitry configured to receive the altered composite clock request signal from the signal processor and a clock oscillator valid signal from a clock oscillator, and to output set and reset signals based on the altered composite clock request signal and the clock oscillator valid signal. The clock oscillator control circuit further includes a set-reset latch configured to receive the set and reset signals from the logic circuitry and to output an enable signal to the clock oscillator.

In another implementation, a method for controlling a clock oscillator is provided. The method includes receiving a composite clock request signal at a signal processor, and outputting a altered composite clock request signal from the signal processor to logic circuitry.

The method also includes receiving a clock oscillator valid signal from a clock oscillator at the logic circuitry, outputting set and reset signals from the logic circuitry to a set-reset latch based on the altered composite clock request signal and the clock oscillator valid signal, and outputting a clock enable signal from the set-reset latch controlled by the set and reset signals.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1A:
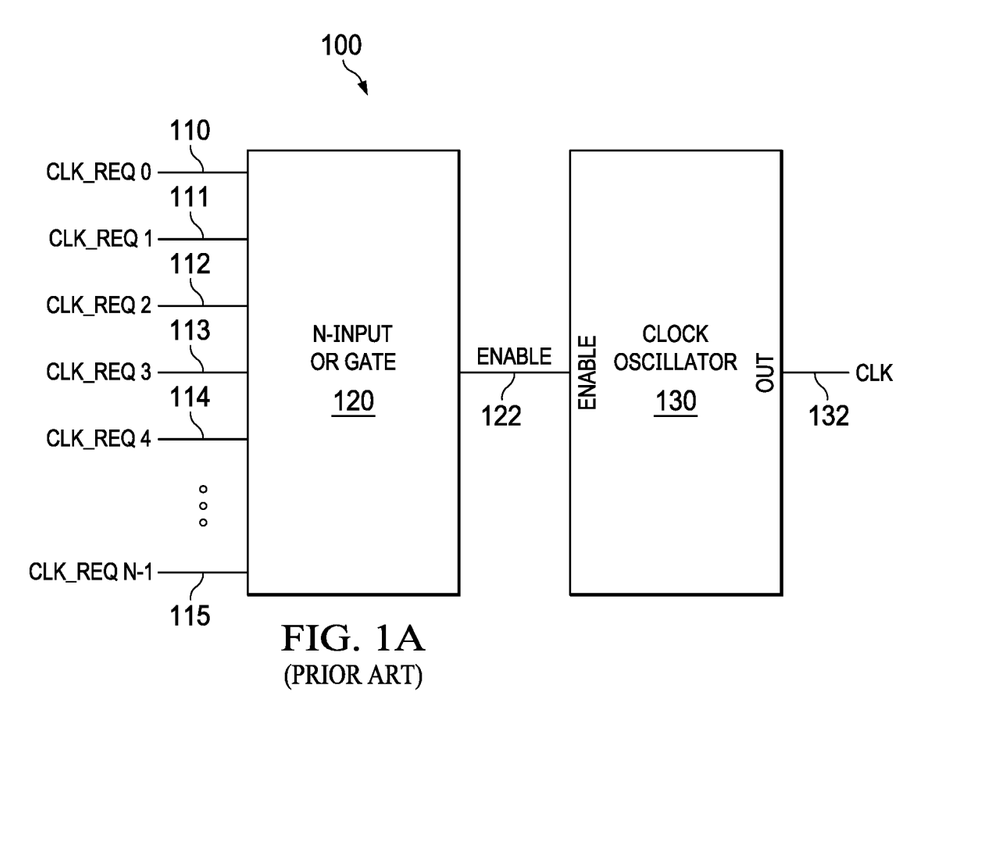
FIG. 1A illustrates a conventional system for controlling a clock oscillator.

FIG. 1A illustrates a conventional system 100 for controlling a clock oscillator. In this example, multiple asynchronous clock request signals (CLK_REQ0 110 through CLK_REQN−1 115) are combined in N-input OR gate (logical OR function) 120 to produce a composite clock request signal (ENABLE) 122 which is then provided to the (ENABLE) input of clock oscillator 130.

Figure 1B:
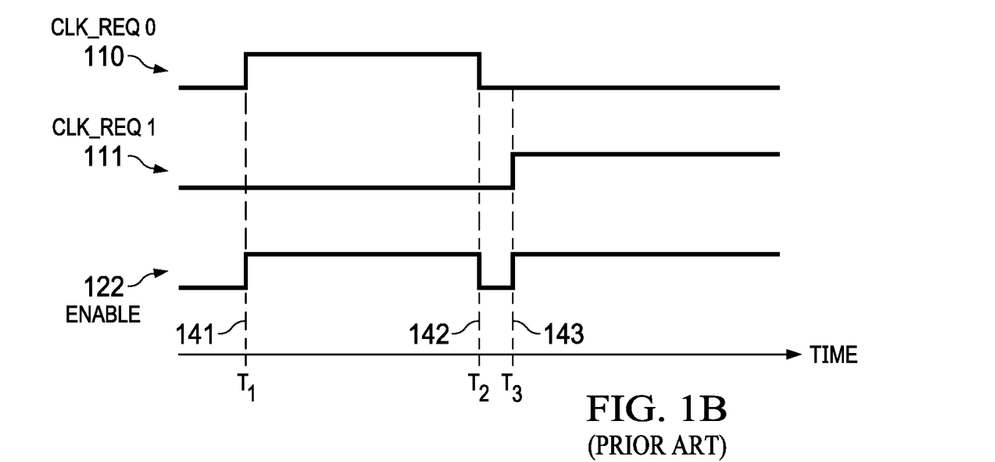
FIG. 1B is a timing diagram illustration the operation of a conventional system for controlling a clock oscillator.

Clock oscillator 130 then produces clock signal (CLK) 132 at its output. As discussed above, each of these clock request signals (CLK_REQ0 110 through CLK_REQN−1 115) is independent and asynchronous, which means that any signal may be asserted or de-asserted at any time. FIG. 1B illustrates this situation in a timing diagram.

FIG. 1B is a timing diagram illustration the operation of a conventional system 100 for controlling a clock oscillator. In this example prior art embodiment, asynchronous clock request signals (CLK_REQ0) 110 and (CLK_REQ1) 111 are illustrated as they are asserted and de-asserted.

The resulting (ENABLE) 122 signal from N-input OR gate 120 is also illustrated. In this example, at time $T_1$ 141 (CLK_REQ0) 110 is asserted (high or 1) and as a result (ENABLE) 122 is also asserted. At time $T_2$ 142 (CLK_REQ0) 110 is de-asserted (low or 0) and as a result (ENABLE) 122 is also de-asserted.

At time $T_3$ 143, shortly after (CLK_REQ0) 110 is de-asserted, (CLK_REQ1) 111 is asserted, and as a result (ENABLE) 122 is also asserted. This 1-0-1 glitch on the (ENABLE) 122 signal may cause clock oscillator 130 to behave unpredictably if the time between $T_2$ and $T_3$ is too short and does not allow clock oscillator 130 sufficient time to stabilize between activations.

In this example embodiment, transient 1-0-1 or 0-1-0 transitions on a signal are termed glitches. Many different circuits may cause signals to momentarily transition to an opposite state during switching, and in many applications these glitches are undesirable as they represent incorrect data. Thus, circuits such as signal processors or signal smoothers are used to eliminate these transitory glitches from signals in order to prevent incorrect data from being latched or processed by downstream circuitry.

Similarly, 0-1-0 glitches on the (ENABLE) 122 signal may cause clock oscillator 130 to behave unpredictably if the (ENABLE) 122 signal is not asserted for a long enough time for the output of clock oscillator 130 to stabilize.

Figure 2A:
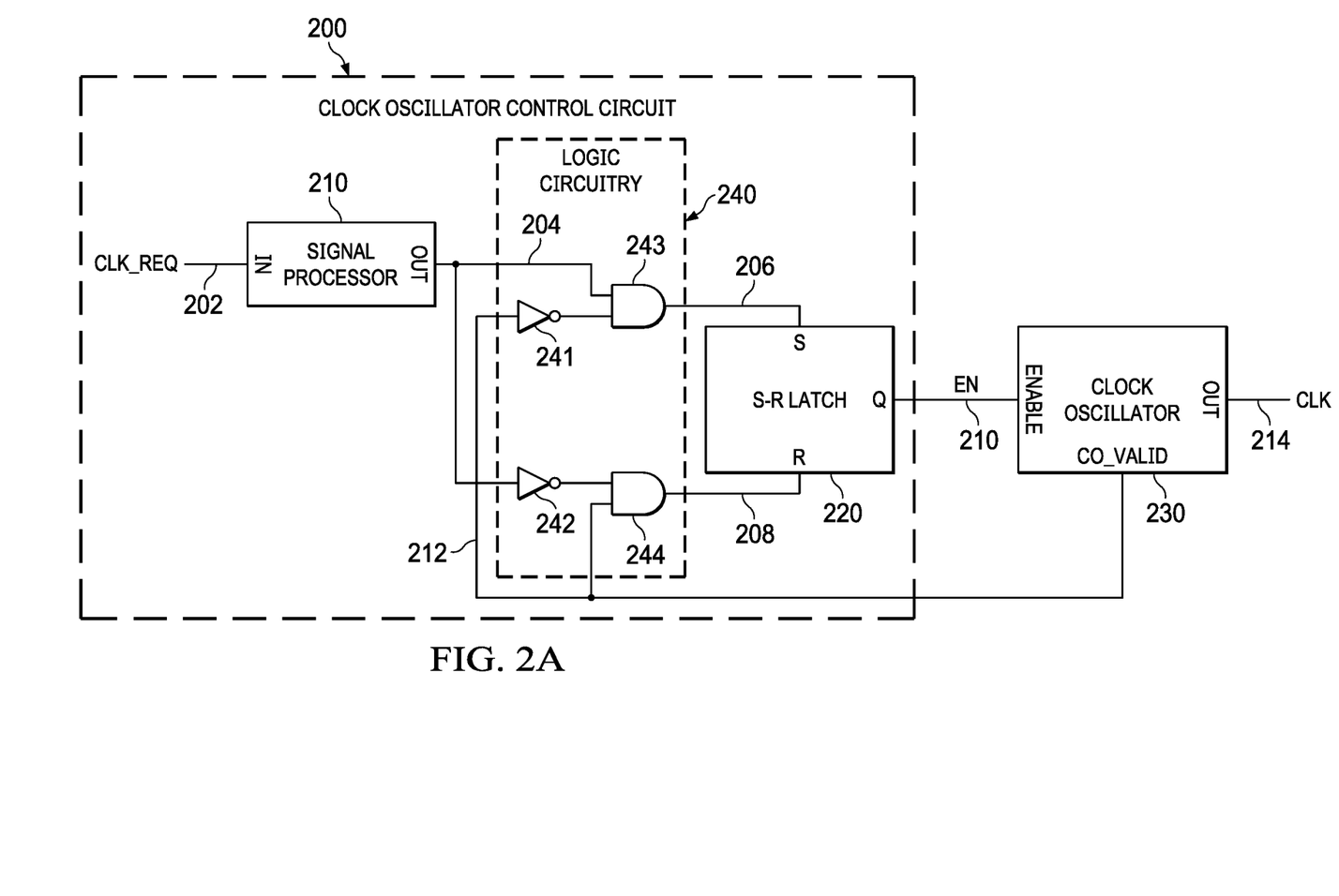
FIG. 2A illustrates an example embodiment of a system for controlling a clock oscillator.

FIG. 2A illustrates an example embodiment of a system 200 for controlling a clock oscillator 230. In this example embodiment, clock oscillator control circuit 200 includes signal processor 210, logic circuitry 240, and set-reset latch 220.

In this example, signal processor 210 receives a composite clock request signal (CLK_REQ) 202 such as that produced by the N-input OR gate 120 of FIG. 1A. This composite clock request signal (CLK_REQ) 202 may include short glitches as described above with respect to FIGS. 1A and 1B.

In this example embodiment, signal processor 210 is configured to remove any transient 1-0-1 or 0-1-0 glitches that are shorter than a glitch threshold time. This glitch threshold time is pre-determined based at least in part on minimum input pulse width requirements of set-reset latch 220. The glitch threshold time may be stored within signal processor 210 or may be provided to signal processor 210 from an external storage location.

In example embodiments, signal processor 210 comprises an electronic circuit, such as a standard cell circuit, ASIC circuit, or the like, configured to receive an input signal and transmit an altered output signal based on the input signal.

Signal processor 210 produces an altered composite clock request signal 204 and provides this signal 204 to logic circuitry 240. In an example embodiment, altered composite clock request signal 204 is a smoothed composite clock request signal 204 which has had any glitches removed from the composite clock request signal (CLK_REQ) 202.

Logic circuitry 240 also receives a clock oscillator valid signal (CO_VALID) 212 from clock oscillator 230 as an input. The clock oscillator valid signal (CO_VALID) 212, when asserted, indicates that the clock output (CLK) 214 of clock oscillator 230 is stable and valid. Note that in some example embodiments, clock oscillator 230 is configured to guarantee a minimum off time before the clock oscillator valid signal 212 is de-asserted.

Logic circuitry 240 processes the altered composite clock request signal 204 and the clock oscillator valid signal 212 and produces a set signal 206 and a reset signal 208 which are provided to, and control, set-reset latch 230. In some embodiments, set-reset latch 230 may comprise a pair of cross-coupled NOR gates, while other embodiments may use other circuits to provide the set-reset latch functionality.

In this example embodiment, logic circuitry 240 is configured to assert the set signal 206 when the altered composite clock request signal 204 is asserted and the clock oscillator valid signal (CO_VALID) 212 is de-asserted, and to assert the reset signal 208 when the altered composite clock request signal 204 is de-asserted and the clock oscillator valid signal (CO_VALID) 212 is asserted.

In this example embodiment, logic circuitry 240 comprises first 241 and second 242 inverters and first 243 and second 244 AND gates. The clock oscillator valid signal (CO_VALID) 212 is coupled to an input of the first inverter 241 and a second input of the second AND gate 244. The altered composite clock request signal 204 is coupled to an input of the second inverter 242 and a first input of the first AND gate 243.

An output of the first inverter 241 is coupled to a second input of the first AND gate 243, and an output of the second inverter 242 is coupled to a first input of the second AND gate 244. An output of the first AND gate 243 provides the set signal 206, and an output of the second AND gate 244 provides the reset signal 208.

The logic circuitry 240 described above is an example embodiment of a circuit configured to provide set 206 and reset 208 signals to set-reset latch 220. Many other configurations of logic circuitry 240 may be used within the scope of the present invention.

In some example embodiments, clock requests may be asserted or de-asserted synchronously using another oscillator or clock source. However, these embodiments may not be ideal in all situations as if another clock source is used for synchronous assertion or de-assertion, the latency of the system is increased since turning on the required clock source takes additional time depending on the frequency of the additional clock source. Also, additional power consumption results from keeping the additional clock source active all the time.

Figure 2B:
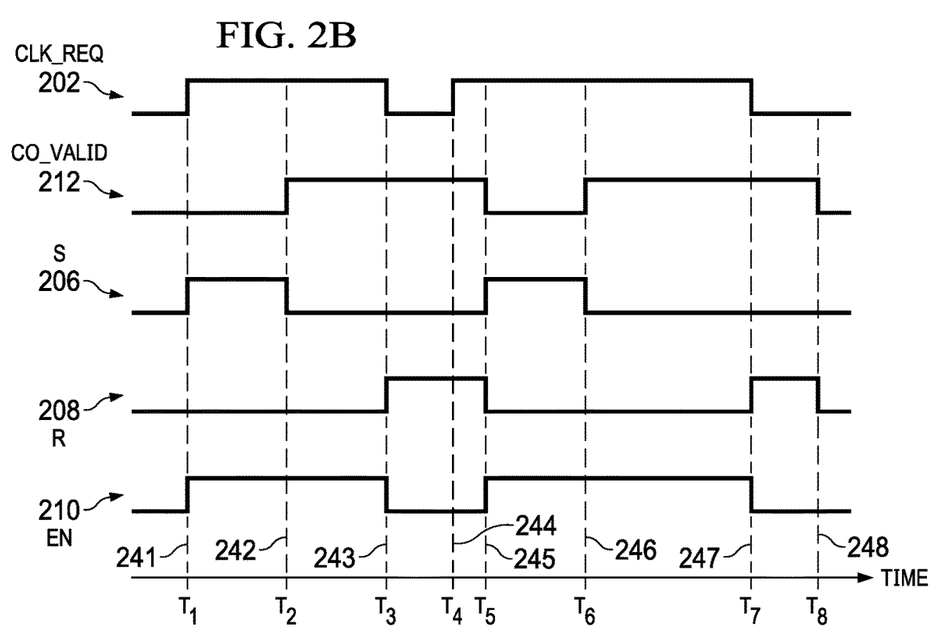
FIG. 2B is a timing diagram illustrating the operation of an example embodiment of a system for controlling a clock oscillator.

FIG. 2B is a timing diagram illustrating the operation of an example embodiment of a system 200 for controlling a clock oscillator 230. In this example timing diagram, at $T_1$ 241 the composite clock request signal (CLK_REQ) 202 is asserted, resulting in the set signal 206 being asserted by logic circuitry 240 and the enable signal (EN) 210 being asserted by set-reset latch 220.

At time $T_2$ 242, some period of time after the enable signal (EN) 210 is asserted, the clock output (CLK) 214 of clock oscillator 230 is active and stable, and clock oscillator 230 asserts the clock oscillator valid signal (CO_VALID) 212. This results in logic circuitry 240 de-asserting the set signal 206.

At time $T_3$ 243, the composite clock request signal (CLK_REQ) 202 is de-asserted, resulting in the reset signal 208 being asserted by logic circuitry 240 and the enable signal (EN) 210 being de-asserted by set-reset latch 220. At time $T_4$ 244, the composite clock request signal (CLK_REQ) 202 is asserted again, however clock oscillator 230 has not yet stabilized from the de-assertion of the enable signal (EN) 210. Since the clock oscillator valid signal (CO_VALID) is still asserted indicating that clock oscillator 230 is still operating, the set signal 206 cannot yet be asserted.

At time $T_5$ 245, the clock oscillator 230 de-asserts the clock oscillator valid signal (CO_VALID) 212, and since clock request (CLK_REQ) 202 is asserted, logic circuitry 240 asserts the set signal 206, and set-reset latch 220 asserts the enable signal (EN) 210. At time $T_6$ 246, the clock output (CLK) 214 of clock oscillator 230 is active and stable, and clock oscillator 230 asserts the clock oscillator valid signal (CO_VALID) 212. This results in logic circuitry 240 de-asserting the set signal 206.

At time $T_7$ 247, the composite clock request signal (CLK_REQ) 202 is de-asserted, resulting in the reset signal 208 being asserted by logic circuitry 240 and the enable signal (EN) 210 being de-asserted by set-reset latch 220. At time $T_8$ 248, the clock oscillator 230 has disabled its clock output (CLK) 214 and de-asserted the clock oscillator valid signal (CO_VALID) 212. This results in logic circuitry 240 de-asserting the reset signal 208.

Figure 3:
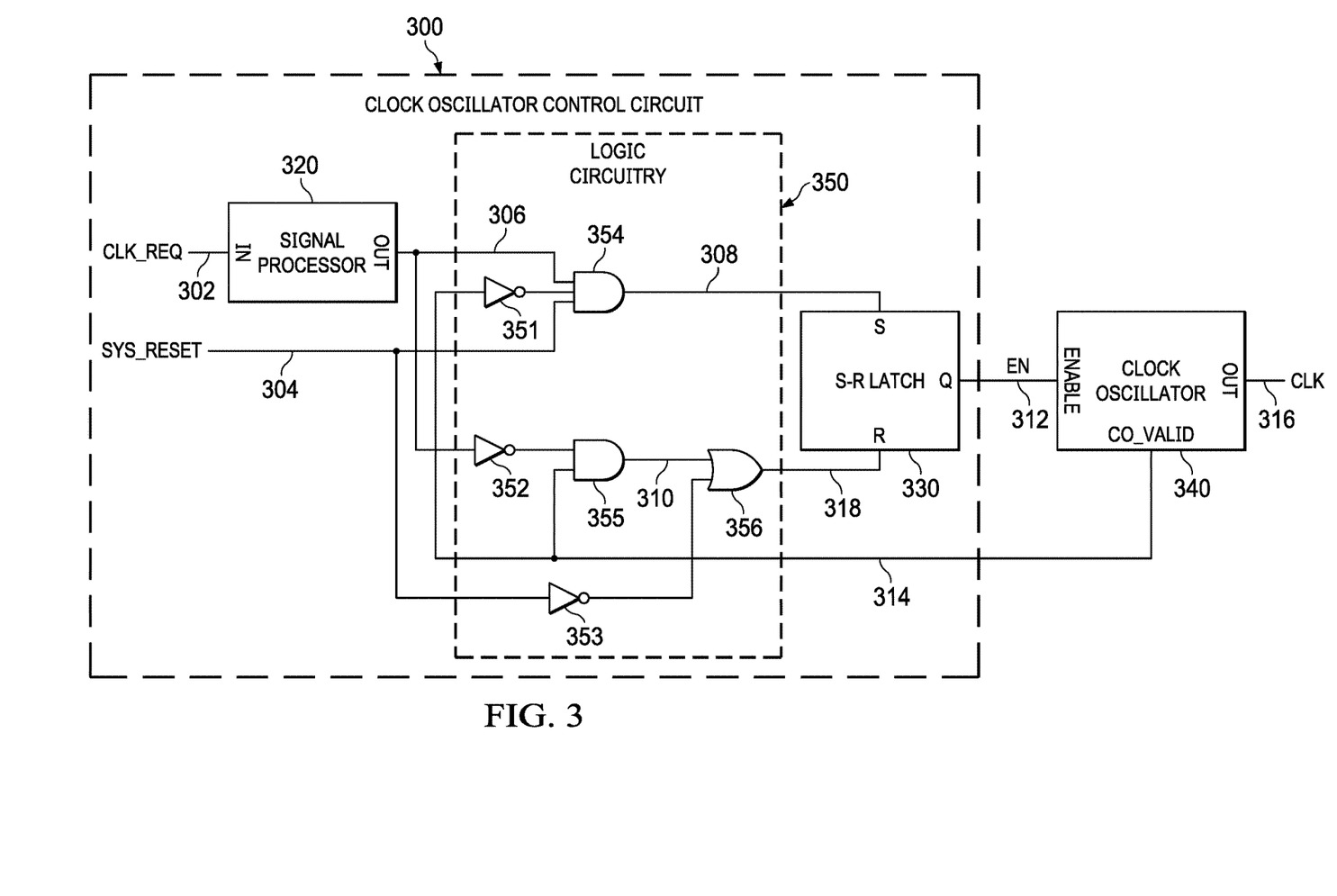
FIG. 3 illustrates an example embodiment of a system for controlling a clock oscillator.

FIG. 3 illustrates an example embodiment of a system 300 for controlling a clock oscillator 340. This example embodiment of a clock oscillator control circuit 300 is similar to the system 200 of FIG. 2A, with the addition of a system reset signal (SYS_RESET) 304 which is used to ensure that the set-reset latch 330 is initialized into a stable state during system reset.

In this example, signal processor 320 receives a composite clock request signal (CLK_REQ) 302 such as that produced by the N-input OR gate 120 of FIG. 1A. This composite clock request signal (CLK_REQ) 302 may include short glitches as described above with respect to FIGS. 1A and 1B.

In this example embodiment, signal processor 320 is configured to remove any transient 1-0-1 or 0-1-0 glitches that are shorter than a glitch threshold time. This glitch threshold time is pre-determined based at least in part on minimum input pulse width requirements of set-reset latch 330. The glitch threshold time may be stored within signal processor 320 or may be provided to signal processor 320 from an external storage location.

In example embodiments, signal processor 320 comprises an electronic circuit, such as a standard cell circuit, ASIC circuit, or the like, configured to receive an input signal and transmit an altered output signal based on the input signal.

Signal processor 320 produces an altered composite clock request signal 306 and provides this signal 306 to logic circuitry 350. In an example embodiment, altered composite clock request signal 306 is a smoothed composite clock request signal 306 which has had any glitches removed from the composite clock request signal (CLK_REQ) 302.

Logic circuitry 350 also receives a clock oscillator valid signal (CO_VALID) 314 from clock oscillator 340 and system reset signal (SYS_RESET) 304 as inputs. Clock oscillator valid signal (CO_VALID) 314, when asserted, indicates that the clock output (CLK) 316 of clock oscillator 340 is stable and valid.

Logic circuitry 350 processes the altered composite clock request signal 306, the clock oscillator valid signal (CO_VALID) 314, and system reset (SYS_RESET) 304 and produces a set signal 308 and a reset signal 318 which are provided to, and control, set-reset latch 330. In some embodiments, set-reset latch 330 may comprise a pair of cross-coupled NOR gates, while other embodiments may use other circuits to provide the set-reset latch functionality.

In this example embodiment, logic circuitry 350 is configured to assert the set signal 308 when the altered composite clock request signal 306 is asserted and the clock oscillator valid signal (CO_VALID) 314 is de-asserted, and to assert the reset signal 318 when the altered composite clock request signal 306 is de-asserted and the clock oscillator valid signal (CO_VALID) 314 is asserted.

During system reset, when the system reset signal (SYS_RESET) 304 is asserted (in this example system reset (SYS_RESET) 304 is asserted when low or 0) logic circuitry 350 is configured to de-assert the set signal 308 and to assert the reset signal 318, ensuring that set-reset latch 330 is in a stable, pre-determined state when the system comes out of reset.

In this example embodiment, logic circuitry 350 comprises first 351, second 352, and third 353 inverters, first 354 and second 355 AND gates, and an OR gate 356. Altered composite clock request signal 306 is connected to a first input of the first AND gate 354 and an input of the second inverter 352. The clock oscillator valid signal (CO_VALID) 314 is connected to an input of the first inverter 352 and a second input of the second AND gate 355.

The system reset signal (SYS_RESET) 304 is connected to a third input of the first AND gate 354 and an input of the third inverter 353. An output of the first inverter 351 is connected to a second input of the first AND gate 354, an output of the second inverter 352 is connected to a first input of the second AND gate 355, and an output of the third inverter 353 is connected to a second input of the OR gate 356.

An output of the first AND gate 354 provides the set signal 308 to set-reset latch 330. An output of the second AND gate 355 is connected to a first input of the OR gate 356. An output of OR gate 356 provides the reset signal 318 to set-reset latch 330.

The logic circuitry 350 described above is an example embodiment of a circuit configured to provide set 308 and reset 318 signals to set-reset latch 330. Many other configurations of logic circuitry 350 may be used within the scope of the present invention.

Figure 4:
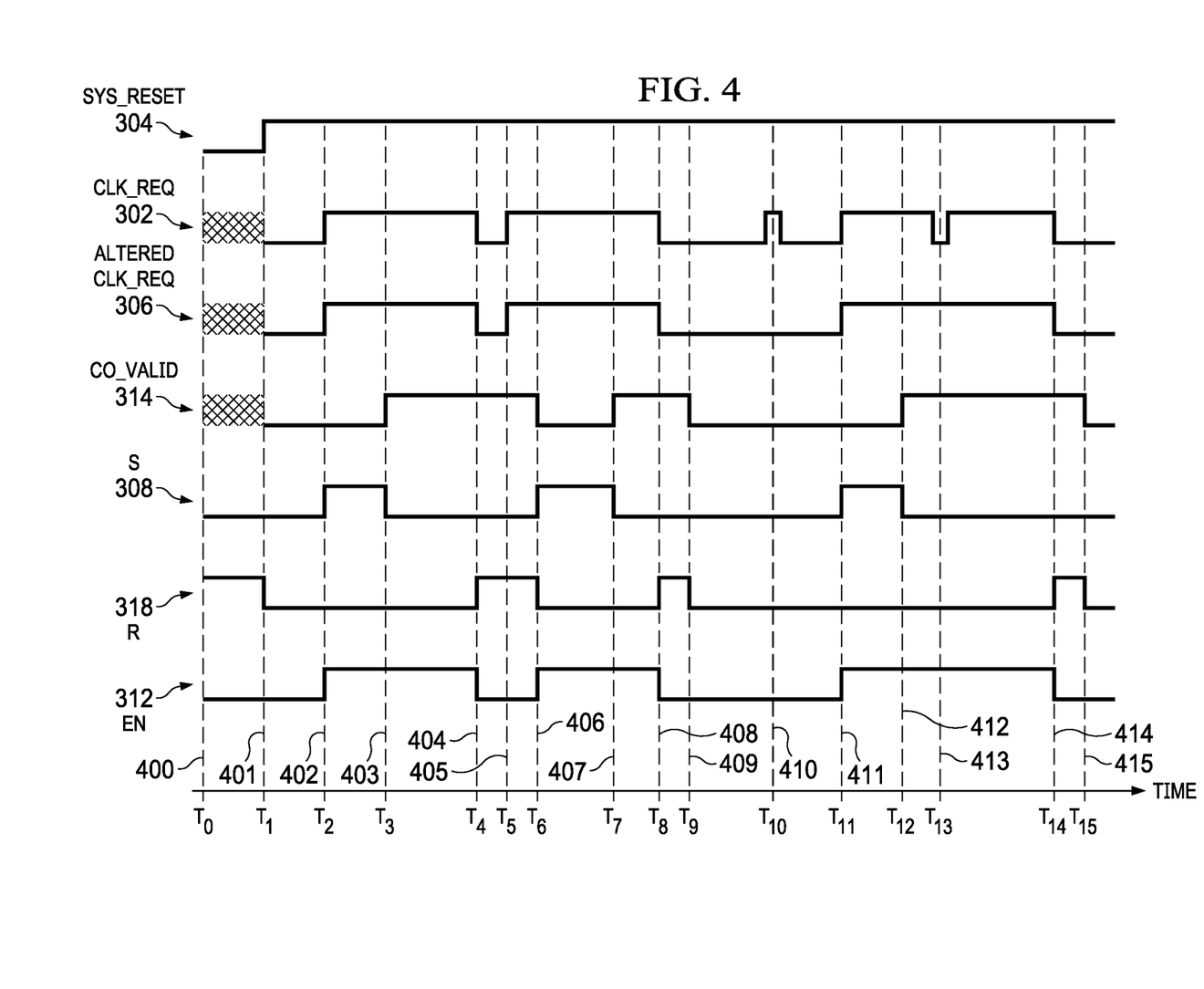
FIG. 4 is a timing diagram illustrating the operation of an example embodiment of a system for controlling a clock oscillator.

FIG. 4 is a timing diagram illustrating the operation of an example embodiment of a system 300 for controlling a clock oscillator 340. In this example timing diagram, initially, at $T_0$ 400, system reset (SYS_RESET) 304 is asserted (low or 0). At $T_0$ 400, the composite clock request signal (CLK_REQ) 302, altered composite clock request signal 306, and the clock oscillator valid signal (CO_VALID) 314 may be in undetermined states. Since system reset (SYS_RESET) 304 is asserted, logic circuitry 350 de-asserts set signal 308 and asserts reset signal 318.

At time $T_1$ 401, system reset (SYS_RESET) 304 is de-asserted (high or 1), and the reset signal 318 is now de-asserted and set-reset latch 330 is in its pre-defined stable state. At time $T_2$ 402, the composite clock request signal (CLK_REQ) 302 is asserted. This results in the altered composite clock request signal 306 also being asserted and logic circuitry 350 asserts the set signal 308, which results in set-reset latch 330 asserting the enable signal (EN) 312.

At time $T_3$ 403, the clock output (CLK) 316 of clock oscillator 340 is running and stable and clock oscillator 340 asserts the clock oscillator valid signal (CO_VALID) 314. This results in logic circuitry 350 de-asserting the set signal 308. At time $T_4$ 404, the composite clock request signal (CLK_REQ) 302 is de-asserted, resulting in altered composite clock request signal 306 being de-asserted, and logic circuitry 350 asserts the reset signal 318 causing set-reset latch 330 to de-assert the enable signal (EN) 312.

At time $T_5$ 405, the composite clock request signal (CLK_REQ) 302 is asserted again, however clock oscillator 340 has not yet stabilized from the de-assertion of the enable signal (EN) 312. Since the clock oscillator valid signal (CO_VALID) 314 is still asserted indicating that clock oscillator 340 is still operating, the set signal 308 cannot yet be asserted.

At time $T_6$ 406, the clock oscillator 340 de-asserts the clock oscillator valid signal (CO_VALID) 314, and since the composite clock request signal (CLK_REQ) 302 is asserted, logic circuitry 350 asserts the set signal 308, and set-reset latch 330 asserts the enable signal (EN) 312. At time $T_7$ 407, the clock output (CLK) 316 of clock oscillator 340 is active and stable, and clock oscillator 340 asserts the clock oscillator valid signal (CO_VALID) 314. This results in logic circuitry 350 de-asserting the set signal 308.

At time $T_8$ 408, the composite clock request signal (CLK_REQ) 302 is de-asserted, resulting in control circuitry 350 asserting the reset signal 318, and set-reset latch 330 de-asserting the enable signal 312. At time $T_9$ 409, clock oscillator 340 has disabled clock output (CLK) 316 and indicated this by de-asserting the clock oscillator valid signal (CO_VALID) 314. In response, logic circuitry 350 de-asserts the reset signal 318.

At time $T_{10}$ 410, a short 0-1-0 glitch appears on composite clock request (CLK_REQ) 302. Since the duration of this glitch is shorter than the glitch threshold time, signal processor 320 removes this glitch, and altered composite clock request 306 does not include the glitch.

At time $T_{11}$ 411, composite clock request (CLK_REQ) 302 is asserted. This results in altered composite clock request 306 also being asserted and logic circuitry 350 asserts the set signal 308, which results in set-reset latch 330 asserting the enable signal (EN) 312.

At time $T_{12}$ 412, the clock output (CLK) 316 of clock oscillator 340 is running and stable and clock oscillator 340 asserts the clock oscillator valid signal (CO_VALID) 314. This results in logic circuitry 350 de-asserting the set signal 308. At time $T_{13}$ 413, a short 1-0-1 glitch appears on composite clock request (CLK_REQ) 302. Since the duration of this glitch is shorter than the glitch threshold time, signal processor 320 removes this glitch, and altered composite clock request 306 does not include the glitch.

At time $T_{14}$ 414, composite clock request (CLK_REQ) 302 is de-asserted, resulting in control circuitry 350 asserting the reset signal 318, and set-reset latch 330 de-asserting the enable signal (EN) 312. At time $T_{15}$ 415, clock oscillator 340 has disabled clock output (CLK) 316 and indicated this by de-asserting the clock oscillator valid signal (CO_VALID) 314. In response, logic circuitry 350 de-asserts the reset signal 318.

Figure 5:
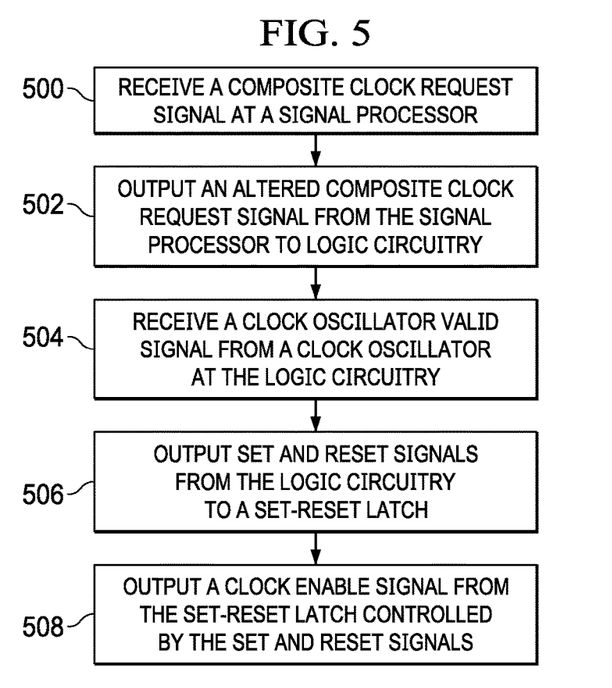
FIG. 5 is a flowchart illustrating an example embodiment of a method for controlling a clock oscillator.

FIG. 5 is a flowchart illustrating an example embodiment of a method for controlling a clock oscillator 230. In this example method a clock oscillator 230 is controlled by a clock oscillator control circuit 200 including a signal processor 210, logic circuitry 240, and a set-reset latch 220.

Signal processor 210 receives a composite clock request signal 202, such as that produced by the N-input OR gate 120 of FIG. 1A, (operation 500). Signal processor 210 then outputs a altered composite clock signal 204 to logic circuitry 240, (operation 502).

Logic circuitry 240 also receives a clock oscillator valid signal (CO_VALID) 212 from clock oscillator 230, (operation 504). Logic circuitry 240 processes the altered composite clock signal 204 and the clock oscillator valid signal (CO_VALID) 212 to produce set 206 and reset 208 signals to control set-reset latch 220, (operation 506).

Set-reset latch 220 produces a clock enable signal (EN) 210 based on the set 206 and reset 208 signals received from logic circuitry 240 and provides the enable signal (EN) 210 to clock oscillator 230, (operation 508).

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. A clock oscillator control circuit, comprising:
    a signal processor configured to receive a composite clock request signal and output an altered composite clock request signal;
    logic circuitry configured to receive the altered composite clock request signal from the signal processor and a clock oscillator valid signal from a clock oscillator, and to output set and reset signals based on the altered composite clock request signal and the clock oscillator valid signal; and
    a set-reset latch configured to receive the set and reset signals from the logic circuitry and to output an enable signal to the clock oscillator.

2. The clock oscillator control circuit of claim 1, wherein the signal processor is configured to remove glitches shorter than a glitch threshold time from the composite clock request signal.

3. The clock oscillator control circuit of claim 2, wherein the glitch threshold time is based at least in part on minimum input pulse width requirements of the set-reset latch.

4. The clock oscillator control circuit of claim 1, wherein the logic circuitry is further configured to assert the set signal when the altered composite clock request signal is asserted and the clock oscillator valid signal is de-asserted, and to assert the reset signal when the altered composite clock request signal is de-asserted and the clock oscillator valid signal is asserted.

5. The clock oscillator control circuit of claim 1, wherein the logic circuitry is further configured to receive a system reset signal and to de-assert the set signal and assert the reset signal when the system reset signal is asserted.

6. The clock oscillator control circuit of claim 1, wherein the clock oscillator is configured to assert the clock oscillator valid signal when a clock output of the clock oscillator is valid.

7. The clock oscillator control circuit of claim 1, wherein the set-reset latch comprises two cross-coupled NOR gates.

8. The clock oscillator control circuit of claim 1, wherein the logic circuitry comprises first and second inverters and first and second AND gates.

9. The clock oscillator control circuit of claim 8, wherein:
    the clock oscillator valid signal is coupled to an input of the first inverter and a second input of the second AND gate;
    the altered composite clock request signal is coupled to an input of the second inverter and a first input of the first AND gate;
    an output of the first inverter is coupled to a second input of the first AND gate;
    an output of the second inverter is coupled to a first input of the second AND gate;
    an output of the first AND gate provides the set signal; and
    an output of the second AND gate provides the reset signal.

10. The clock oscillator control circuit of claim 1, wherein the composite clock request signal is generated by a logical OR of a plurality of clock request signals.

11. A method for controlling a clock oscillator, comprising:
    receiving a composite clock request signal at a signal processor;
    outputting an altered composite clock request signal from the signal processor to logic circuitry;
    receiving a clock oscillator valid signal from the clock oscillator at the logic circuitry;
    outputting set and reset signals from the logic circuitry to a set-reset latch based on the altered composite clock request signal and the clock oscillator valid signal; and
    outputting a clock enable signal from the set-reset latch controlled by the set and reset signals.

12. The method of claim 11, wherein the signal processor is configured to remove glitches shorter than a glitch threshold time from the composite clock request signal.

13. The method of claim 12, wherein the glitch threshold time is based at least in part on minimum input pulse width requirements of the set-reset latch.

14. The method of claim 11, wherein the logic circuitry is configured to assert the set signal when the altered composite clock request signal is asserted and the clock oscillator valid signal is de-asserted, and to assert the reset signal when the altered composite clock request signal is de-asserted and the clock oscillator valid signal is asserted.

15. The method of claim 11, further comprising:
receiving a system reset signal; and
de-asserting the set signal and asserting the reset signal when the system reset signal is asserted.

16. The method of claim 11, wherein the clock oscillator is configured to assert the clock oscillator valid signal when a clock output of the clock oscillator is valid.

17. The method of claim 11, wherein the set-reset latch comprises two cross-coupled NOR gates.

18. The method of claim 11, wherein the logic circuitry comprises first and second inverters and first and second AND gates.

19. The method of claim 18, further comprising
receiving the clock oscillator valid signal at an input of the first inverter and at a second input of the second AND gate;
receiving the altered composite clock request signal at an input of the second inverter and at a first input of the first AND gate;
providing an output of the first inverter to a second input of the first AND gate;
providing an output of the second inverter to a first input of the second AND gate;
providing an output of the first AND gate as the set signal; and
providing an output of the second AND gate as the reset signal.

20. The method of claim 11, wherein the composite clock request signal is generated by a logical OR of a plurality of clock request signals.

* * * * *